United States Patent
Hill et al.

(10) Patent No.: US 6,618,833 B1
(45) Date of Patent: Sep. 9, 2003

(54) MAINTENANCE OF A SYSTEM MODEL

(75) Inventors: Mark Hill, Bath (GB); Hendrick-Jan Agterkamp, Bristol (GB); Andrew Sturges, Bath (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 0 days.

(21) Appl. No.: 09/457,921

(22) Filed: Dec. 9, 1999

(30) Foreign Application Priority Data

Dec. 29, 1998 (GB) .............................................. 9828795

(51) Int. Cl.⁷ .............................................. G06F 17/50
(52) U.S. Cl. ................................. 716/1; 707/1; 707/102
(58) Field of Search ............................. 716/4, 5, 18, 1; 707/1, 102

(56) References Cited

U.S. PATENT DOCUMENTS

| | | | |
|---|---|---|---|
| 5,553,218 A | * 9/1996 | Li et al. ...................... | 707/102 |
| 5,557,774 A | 9/1996 | Shimabukuro et al. ....... | 703/21 |
| 5,615,367 A | * 3/1997 | Bennett et al. .............. | 345/700 |
| 5,734,887 A | * 3/1998 | Kingberg et al. ............ | 707/100 |
| 5,848,263 A | 12/1998 | Oshikiri ...................... | 716/3 |
| 6,237,003 B1 | * 5/2001 | Lewish et al. ............... | 700/103 |
| 6,356,897 B1 | * 3/2002 | Gusack ........................ | 707/10 |

FOREIGN PATENT DOCUMENTS

| | | | | |
|---|---|---|---|---|
| EP | 0463301 A2 | * 1/1992 | ........... | G06F/15/60 |
| EP | 0 847 022 | 6/1998 | ........... | G06F/17/50 |

OTHER PUBLICATIONS

Ghosh, I. et al., "A design for testability technique for register transfer level circuits using control/data flow extraction", IEEE, pp. 706–723.*

Standard Search Report from application No. RS102362.

Ibbett R. N. et al., *Hase: A Flexible Toolset for Computer Architects*, Computer Journal, vol. 38, No. 10, Jan. 1, 1995, pp. 755–764, XP000584673.

British Search Report from patent application No. 9828795.6, filed Dec. 29, 1998.

* cited by examiner

*Primary Examiner*—John F. Niebling
*Assistant Examiner*—Stacy Whitmore
(74) *Attorney, Agent, or Firm*—Wolf, Greenfield & Sacks, P.C.; James H. Morris; Robert A. Skrivanek, Jr.

(57) ABSTRACT

A method of automated generation of a set of design data defining a system model from an architecture database which is configured to hold in an electronic storage medium architectural parameters wherein each architectural parameter is defined by a primary key field and a set of fields holding subsidiary data relating to the primary key, the method comprising, reading the primary key for each architectural parameter, generating in an electronic storage medium a structured definition entry of the architectural parameter in an electronically readable format, the structured definition entry being associated with an identification field defining the parameter, and loading the primary key into the identification field and the subsidiary data into the structured definition file, and wherein the structured definition entry takes the form of a programming definition of the architectural parameter in a modelling language.

17 Claims, 3 Drawing Sheets

| | |
|---|---|
| + = mnem | ⎯ PKF |
| + name | ⎯ SDF1 |
| + op1 | ⎯ SDF2 |
| + op2 | ⎯ SDF3 |
| + op3 | ⎯ SDF4 |
| + args | ⎯ SDF5 |
| + pretext | ⎯ SDF6 |
| + traps | ⎯ SDF7 |
| + postext | ⎯ SDF8 |
FIG. 3
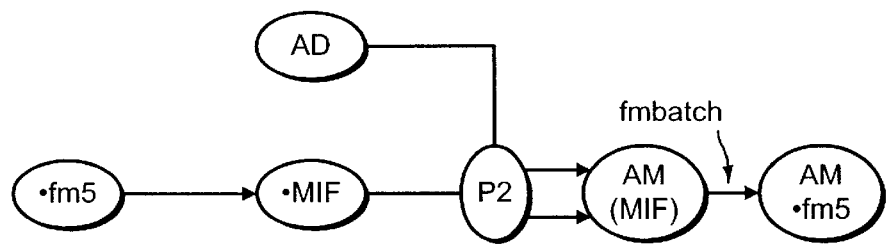
FIG. 4
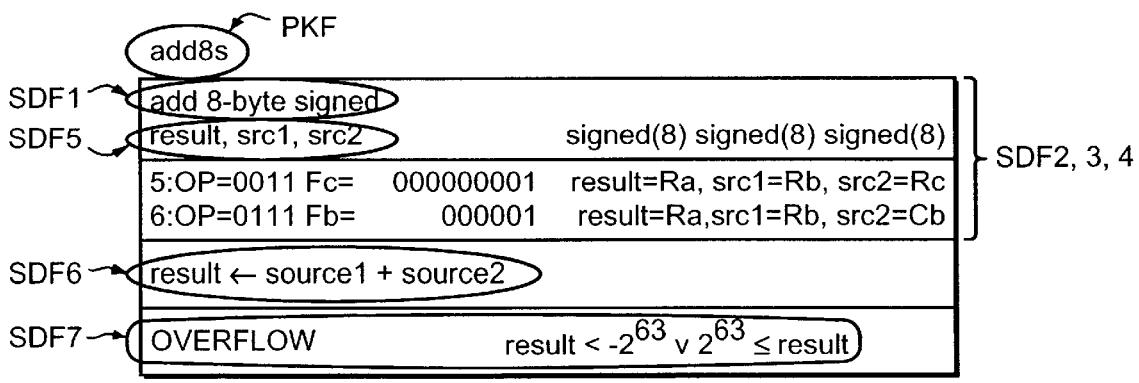
FIG. 5

MAINTENANCE OF A SYSTEM MODEL

FIELD OF THE INVENTION

This invention relates to the specification and development of systems and processors, and in particular to the maintenance of data defining a system model.

BACKGROUND OF THE INVENTION

Traditional design flows for processors and systems involve the production of an architectural specification from which all design and development is based. This architectural specification is, typically, either a written specification or an executable "golden" model written in some programming language. The main problem with this approach is that when dealing with such complex system it is extremely unlikely that the specification will be correct first time. Inevitably, for a substantial period of the project, changes will be required as feedback is received from, among others, marketing, customers, hardware designers and software developers. This requires changes in the specification which, once agreed, need to propagate to all the groups reliant upon it, for example: modelling, micro-architecture, verification, toolchain, OS, applications and documentation. This update process will happen many times in the lifecycle of a project and is usually performed manually by each group; an approach which is slow, error-prone and labour intensive.

It is an aim of the invention to reduce the time, cost and errors associated with iterating the architectural specification of a device.

SUMMARY OF THE INVENTION

According to one aspect of the invention there is provided a method of operating a computer to generate a set of electronic data defining a system model from an architecture database which is configured to hold in an electronic storage medium architectural parameters wherein each architectural parameter is defined by a primary key field and a set of fields holding subsidiary data relating to the primary key, the method comprising: reading the primary key for each architectural parameter; generating in an electronic storage medium a structured definition entry of the architectural parameter in an electronically readable format, the structured definition entry being associated with an identification field defining the parameter; and loading the primary key into the identification field and the subsidiary data into the structured definition file.

According to another aspect of the invention there is provided a method of designing a processor comprising: defining a processor specification and generating from the processor specification architectural parameters implementing the specification; loading the architectural parameters into an electronic storage medium to create an architectural database which is configured to hold in an electronic storage medium architectural parameters wherein each architectural parameter is defined by a primary key field and a set of fields holding subsidiary data relating to the primary key; creating in an electronically readable medium text in a humanly readable format defining the architectural parameters in a structured tabular format wherein a table title holds the primary key for each architectural parameter; modifying the processor specification and effecting manually consequential modification to the architectural parameters in the text; and using a translation tool in the form of a program executed by a computer to automatically transfer the modification into the database by locating any new or modified tables in the tabular format and loading the table title into the primary key field and other data in the table into the set of fields for subsidiary data in a predetermined manner.

According to another aspect of the invention there is provided a method of designing a processor comprising: defining a processor specification and generating from the processor specification architectural parameters implementing the specification; loading the architectural parameters into an electronic storage medium to create an architectural database which is configured to hold architectural parameters wherein each architectural parameter is defined by a primary key field and a set of fields holding subsidiary data relating to the primary key; creating in an electronically readable medium text in a humanly readable format defining the architectural parameters in a structured tabular format wherein a table title holds a primary key for each architectural parameter; modifying the processor specification and effecting manually consequential modifications to the architectural parameters in the architectural database; and using a translation tool in the form of a program executed by a computer to automatically transfer the modifications into the text from the database by loading the contents of the primary key field and subsidiary fields into the structured tabular format.

Thus, the structural definition entries can be tables used to generate readable text or programming definitions for generating modelling views.

Automating the distribution of architectural data dramatically reduces the impact of changes in the specification on project time scales. For example, with the use of appropriate views, it is simpler to keep the toolchain (compiler, assembler, linker and simulator) in step with each other and the specification.

As there is a reduction in the amount of manually replicated architectural data produced in different groups, inconsistencies are far less likely to creep in.

The quality of the written specification should improve for a number of reasons.

The translation tools can be arranged to carry out "sanity checks" on the architectural data flowing from, or to, the written specification, thus reducing errors.

Consistency is improved as the automation ensures that similar types of information, for example, register descriptions are presented in the same way.

Clarity can be improved by being free to present the same information in different ways without the possibility of inconsistencies arising. For example, giving opcode information as part of an instruction description as well as in an opcode summary table.

BRIEF DESCRIPTION OF THE DRAWINGS

For a better understanding of the present invention and to show how the same may be carried into effect, reference will now be made by way of example to the accompanying drawings.

FIG. 3 is a diagram of a database entry in the architectural database;

FIG. 4 is a flow chart illustrating how text in an architectural manual is generated from the architectural database;

FIG. 5 is an example of a text entry in the architectural manual for an instruction;

DESCRIPTION OF THE PREFERRED EMBODIMENT

Figure 1:
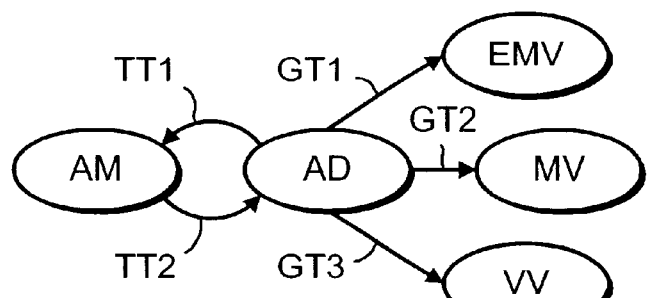
FIG. 1 is a schematic diagram illustrating the concept underlying the present invention.

FIG. 1 illustrates schematically the process flow in a design process of an integrated circuit system and in particular of a processor. A specification for the processor is established and is defined as a set of functional requirements and performance requirements. These functional requirements and performance requirements are used to generate a set of architectural parameters which will be used to design the processor. The architectural parameters are held in two separate formats. The first format is text in a humanly readable form which is referred to herein as the written specification or architecture manual AM. The written specification can be provided in a printed format, but it is also generally provided in an electronic format on an electronically readable medium such as a disk or in memory. Thus, the reference AM in FIG. 1 denotes a disk which holds the written specification which can be displayed or printed in a humanly readable format. The other centralised store is an architectural database AD which is also provided in an electronic format either on disk or on a system memory. In the architectural database, architectural information is maintained in a canonical form, as exemplified later herein. The architectural information held in the architectural database AD can then be used to generate a plurality of different views to aid in the design process. Thus, for example, an executable model view EMV in a modelling language such as C, a micro-architecture view MV and a verification view VV may be generated. Other views are possible. The generation of these views can be automated to the extent that they rely on architectural information held in the architectural database AD as exemplified further herein.

The architecture manual AM and the architecture database AD are "bound" in the sense that the information contained therein can be kept compatible in an automated fashion.

According to the first and preferred embodiment, the architectural database AD is the primary source for the architectural information and is set up according to the architectural parameters defined when the processor's specification is generated. The text for the architecture manual AM can be automatically generated from the architectural database using a translational tool TT1. Likewise, any modifications which are made to the architectural parameters during the design process and used to update the architectural database, will automatically update the architecture manual AM through the translational tool TT1.

According to an alternative embodiment, the architecture manual AM can form the primary source of information for the architectural parameters, be subject to modifications reflecting changes in the processor's specification during the design process. These modifications can then be imported into the architectural database AD using a second translational tool TT2.

It will be appreciated that the architecture manual may include data and descriptions of the processor's specification which are not incorporated in the architectural database. The architectural database will hold as many aspects of the architecture which can be expressed in a reasonably formal form.

The generation of various views as illustrated in FIG. 1 can be done using various generation tools GT1,GT2,GT3 etc to present the architectural information held in the architectural database in a form suitable for that particular view. For example, the micro-architecture view MV intended for a micro-architect may have details of the architectural parameters as a VHDL header file. In comparison, a compiler using an executable model view EMV might expect a two-specific structure in C language (.c).

The architectural parameters held in the architectural database can fall in a number of different classes. For example, the classes can include:

instructions opcodes system registers control registers.

All of these classes contain elements which can be expressed in a reasonably systematic fashion. According to the following example, the layout of an instruction set database is illustrated.

Figure 2:
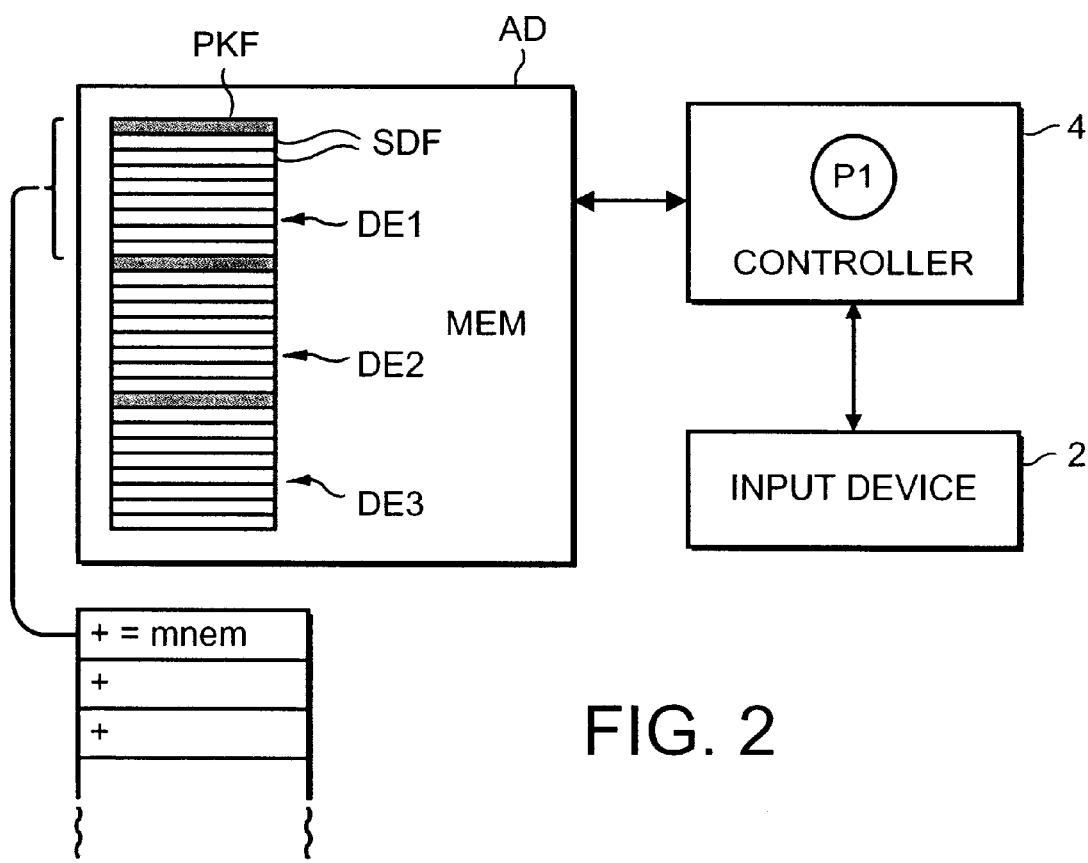
FIG. 2 is a block diagram of a computer system including an architectural database.

FIG. 2 is a block diagram of a computer system including the architectural database AD in the form of a memory MEM holding database entries DE1,DE2,DE3 etc. It will be appreciated that FIG. 2 is entirely schematic and that in practice a large number of data entries DE will be held in the architectural database and they can be held in any organised format. According to the present example, each data entry takes the form of a primary key field PKF and a set of subsidiary data fields SDF. For an instruction set, the primary key field is opened by the denotation:

+=.

For an instruction set, the primary key field holds the instruction mnemonic. Each subsidiary field is then opened by the sign:

+.

FIG. 2 also illustrates an input device 2 coupled to a controller 4 which has access to the memory MEM for accessing the architectural database AD via a suitable program P1. That program can be for example tcl which is an object-oriented extension of the tcl scripting language and is suitable for accessing a database of this type.

FIG. 3 illustrates in more detail the database fields for an instruction database entry. The primary key field holds the instruction mnemonic. The first subsidiary data field SDF1 holds the instruction name. The second, third and fourth subsidiary data fields SDF2,SDF3,SDF4 are associated respectively with each operand and are named op1,op2 and op3. They contain per operand attributes such as signedness (s,us), size, type (register, constant, any) and direction of use (src,dst). The next field SDF5 is denoted args and is used to give meaningful names to any operands used by the instruction. The next three fields SDF6,SDF7 and SDF8 entitled pretext, traps and posttext capture the functional behaviour of the instruction before and after any trap checks are performed. Specific example of the database entry for instructions add8s, leapngz are given in Annexe Ia,Ib.

Annexe II illustrates an extract from the program P1 in itcl for accessing the architectural database of this format. The output of that access is given in Annexe III.

FIG. 4 is a flow chart illustrating the use of the architectural database AD in establishing entries in the architectural manual AM. In this particular example, the format of the architecture manual is in Framemaker, denoted by .fm5. It is converted into .MIF by a known conversion tool. MIF is a highly structured textural representation of the contents of a Framemaker document, and is known per se. In particular, the format in MIF is a tree-like structure in which tables can be represented, each table being identified by a table title. A program P2 executable on a computer system creates the architecture manual entry by evaluating the commands given in selected subsidiary data fields. For example, for the example of FIG. 3, the commands given in the pretext, traps and posttext fields SDF6,SDF7 and SDF8 are evaluated in an environment of MIF generating procedures. For example, the generated MIF sequence for the instruction pretext is given in Annexe IV.

The process P2 also inserts the MIF representation of the instruction into the correct place in the architecture manual AM by providing pattern, matching and substitution facilities for MIF structures. This is done by identifying new tables in the MIF structure which require completion from the architectural database, or tables which have been modified. For new or modified tables, a new table based on the information in the current architectural database AD is inserted into the text of the architecture manual. As an example, FIG. 5 illustrates the complete entry for the add8s instruction exemplified in Annexe I. FIG. 5 also illustrates the data fields of the database entry which has been transferred into the table entry.

It will be apparent from FIG. 5 that in order to create the tabular entry, extra processing needs to be carried out on the opcode fields SDF2,3 and 4 to generate from the attributes within those fields the necessary information for the relevant table entries.

Figure 6:
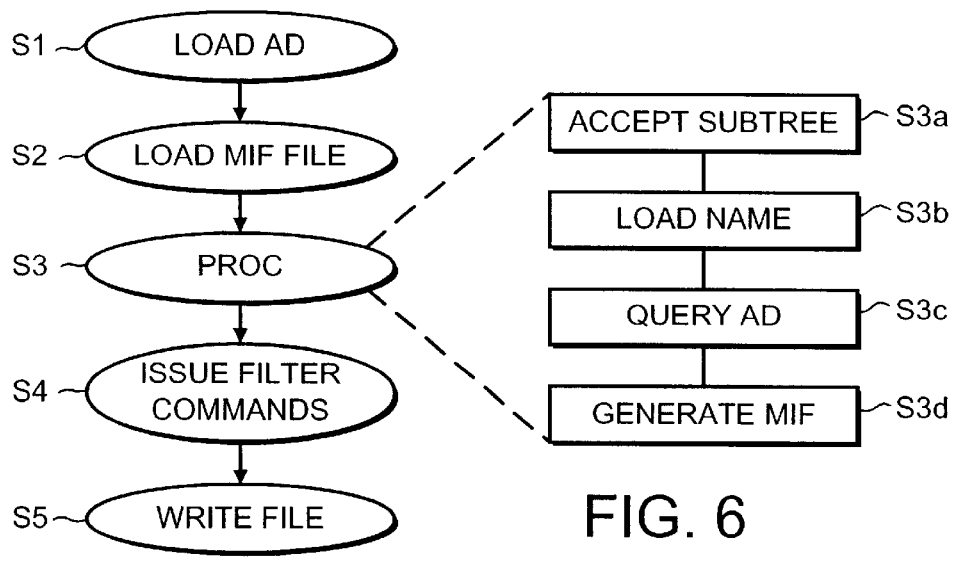
FIG. 6 is a flow chart of a text generation process.

FIG. 6 is a flow diagram of how the program P2 operates to update the architecture manual AM from the architectural database AD. It will be appreciated herein that the architectural database includes a number of classes of parameters which may themselves constitute individual architectural databases. For example, the instruction architectural database may constitute a separate entity to the opcode architectural database.

At step S1, the architectural databases of the relevant classes of architectural parameters are loaded. At step S2, the MIF file is loaded using the MIF manipulation command "parsefile". This command reads the contents of the MIF file and records its entire contents in an abstract syntax tree (AST) constructed from C language structures.

According to step S3, a procedure is defined which accepts as an argument an MIF sub-tree representation of the structural entries held in the architectural databases. The body of this procedure extracts from the sub-tree the name of the instruction then uses this name to query the instruction opcode databases (see steps S3a to S3c). From these databases it obtains all the information that is to be presented within the instruction description and then converts this raw data into MIF by inserting all the required structure and format information (see step S3d). Finally the procedure removes the old instruction description from the abstract syntax tree and replaces it by the newly generated MIF.

According to step S4 of the main procedure, an MIF manipulation command "filter" is then issued which supplies as arguments a pattern which will match the table structure used to describe an instruction and the name of the procedure defined in step S3. The filter command traverses the MIF AST looking for a match between the tree and the specified pattern. If a match is found then the procedure whose name was passed as an argument to the command is invoked. The procedure is passed the identity of the matched sub-tree plus the identities of any sub-patterns in it.

In addition, other "filter" commands can be issued to update indexes, opcode summaries, instruction summaries etc.

According to step S5, the "writefile" command causes the modified AST to be written back out to a file. Then, the procedure is terminated.

Figure 7:
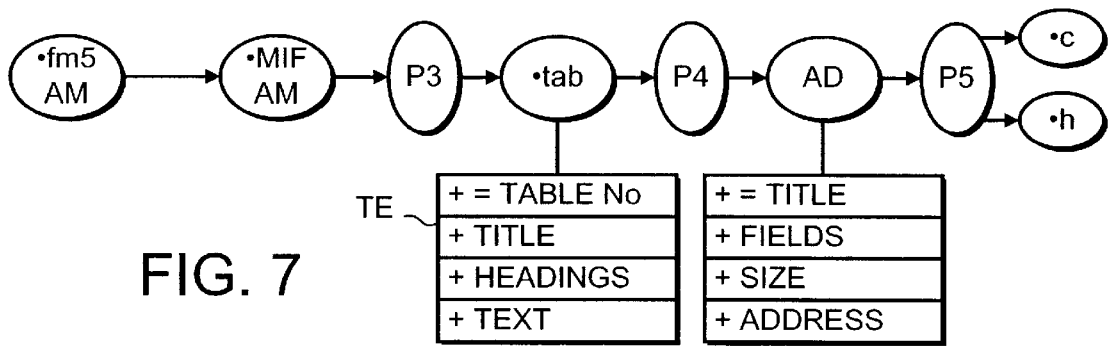
FIG. 7 is a flow chart illustrating how the architectural database is generated from text in the architectural manual.

FIG. 7 is a flow chart which illustrates how information is generated for the architectural database AD from the architecture manual. As already mentioned, the architectural manual is by way of example written in Framemaker referred to as .fm5 in FIG. 5. It is converted into MIF. Then, a program P3 executable on a computer reads the text in the MIF format of the architecture manual and extracts tables from that text to form an interim tabular database tab. In that database, tables are stored as table entries TE with the format as data entries DE in the architecture database. That is, a primary key field denoted += holds the table number and is associated with a plurality of subsidiary fields which hold for example the title and headings of that table. A further process P4 extracts the information from the table database tab and generates the architectural parameters for the architecture database AD of the format described hereinabove. FIG. 7 also shows by way of example the use of a program P5 to generate from the architectural parameters a header file .h, and an implementation file .c.

This process can be used for all classes of architectural parameters held in the architectural database. It is described below with reference to system control registers which are a class of architectural parameters held in the architectural database.

All of the memory mapped (system) registers within the processor are specified in the architecture manual AM using a standard tabular form of the type illustrated for example in Table 1.

The frame document representation of the architecture manual is converted into MIF for example using a program entitled FMBATCH. Then, the process P3 converts the MIF file into a raw table database .tab in the database format. A table identifier is used as the primary key for each entry in the table database, the identifier being generated using the table type plus a unique three digit number. The table identifier is associated with three subsidiary fields headed:

title headings text.

The program P4 then converts the table database to data entries in the architectural database AD. It also performs a "sanity check" on each table which describes a register, for example ensuring that the range of bits associated with a particular field is consistent with its size. In the database format described above, the primary key field holds the register name, followed by fields named fields, size and address. The fields are described one per line using five parameters:

name, start bit, width, access attribute (RW/RO) and initial value.

The size field is the width of the register in bytes. The address is specified relative to the base address of the processor.

The format of the table in the table database .tab is illustrated in Table 2. The equivalent data entry in the architectural database is illustrated in Table 3.

By way of example, production of an executable model view EMV by the process P5 will now be described. The technique used is similar to that described above to generate the architecture manual. However, instead of the pretext, posttext and traps fields SDF6,SDF7 and SDF8 being evaluated in an environment of MIF generating commands, the environment is a modelling language such as C++ which generates a representation suitable for use within an executable model.

Figure 8:
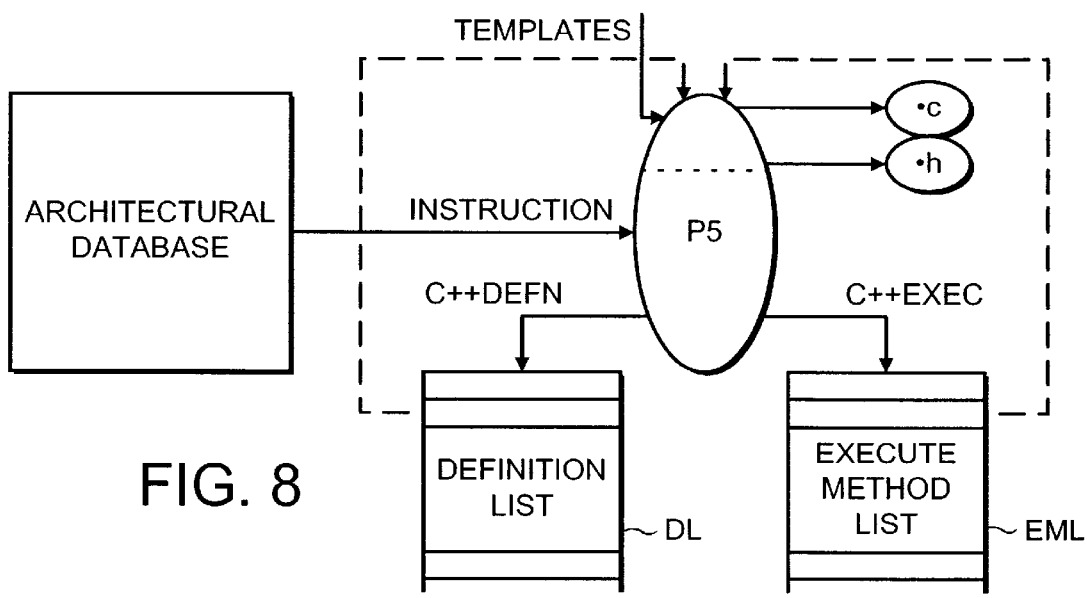
FIG. 8 illustrates generation of the modelling views.

Reference is made to FIG. 8. The process P5 will broadly be considered in two parts as illustrated diagrammatically in the dotted line going across the oval marked P5. According to the first part, a definition list DL and an execute method list EML are generated for instructions in the architectural database AD. This is done as follows:

i) read the instruction database;
  ii) get an instruction from the database;
  iii) generate a C-class definition for the instruction incorporating details of the operand usage (the src and dst attributes which are held in the operand fields SDF2, SDF3 and SDF4);
  iv) append new definition to the definition list DL;
  v) create a C++ execute method for the instruction using the operand usage information and also the pretext, traps and posttext fields SDF6,SDF7,SDF8 to produce code describing the behaviour of the instruction;
  vi) append the new execute method to the execute method list;
  vii) repeat from step ii) until all instructions processed.

The C++ class definition generated for the add8s and leapngz instructions exemplified in Annexes Ia and Ib are illustrated in Annexes Va and Vb. The implementation of the execute methods are also given as in Annexe VIa, VIb.

Once the definition list DL and execute method list EML have been generated in this way, the other part of the process P5 receives templates for a header file and an implementation file. In order to generate a header file .h, the template marker is substituted with the definition list. In order to generate an implementation file .c, the template marker is substituted with the execute method list. In this manner, the implementation file .c and the header file .h can be generated.

In Annexes V and VI, reference is made to an InstrState class. This class contains all the state associated with the execution of an instruction, for example an array of operands and a record of any trap caused by the instruction. Reference is also made to an integer class, which supports unlimited precision integers. This may be required because the results of expressions may exceed the size of the result operand and overflow may need to be checked as part of execution of the instruction.

ANNEXE Ia

```
+=add8s
+name add 8-byte signed
+op1 dst, 8, s, register
+op2 src, 8, s, register
+op3 src, 8, s, any
+args result, src1, src2
+pretext result [becomes] src1 + src2
+traps [exetrap OVERFLOW {
result [lt] [power −2 63] [1or]
[power 2 63] [lessequal] result
}]
+posttext
```

ANNEXE Ib

```
+=leapngz
+name branch if not greater than zero
+op1 nul
+op2 nul
+op3 src, z, s, register
+args condition
+posttext
[IF {condition [lessequal] 0}
  { [IPTR_] [becomes] [IPTR] }
]
+traps
```

-continued

ANNEXE II

```
package require Dbase
Dbase iset
iset read InstructionSet.db
foreach m [iset entrylist] {
puts "$m :: [iset entry name]"
}
```

ANNEXE III add8s :: add 8-byte signed

ANNEXE IV

```
<ParaLine
    <String 'result'>
    <Font
    <FTag 'Symbol'>
    <FSize 7.0 pt>
    <FLocked No>
    > # end of Font
    <String '\xac'>
    <Font
    <FTag ''>
    <FLocked No>
    > # end of Font
    <String 'source1 + source2'>
    > # end of ParaLine
```

ANNEXE Va

```
class Instr_add8s : public Instr
{
    public:
        Instr_add8s()
        :
          Instr("add8s",Arguse(6) ,Arguse(1))
        {}
        void execute(InstrState &is );
}
```

ANNEXE Vb

```
class Instr_leapngz : public Instr
{
    public:
        Instr_leapngz ()
        :
          Instr("leapngz",ArgUse(1) ,Arguse(0))
        {
        }
        void execute(InstrState &istate );
};
```

ANNEXE VIa

```
Instr_add8s :: execute(InstrState &is)
{
  bool undef=! (is.op2[0].is_defined() &&
                         is.op3 [0],is_defined ());
  Integer result;
  Integer source1(is.op2[0].as_TI8s());
  Integer source2(is.op3[0].as_TI8s())'
  result = source1 + source2;
  if (result < power.pow_M2_63||
      power.pow_2_63 <= result)
      is.trap.set(TRAP_OVERFLOW ());
  if (is.trap.is_set()) [return;}
  if (undefined)
      is.op1[0].undef(result.as_TI8us());
  else
      is.op1[0] = result.as_TI8us();
}
```

ANNEXE VIb

```
void Instr_leapngz::execute( InstrState &istate )
{
  bool undefined = !(1 && istate.operands[0] ().get().is_defined
        ());
  Integer condition{istate.operands[0] ().get().as_TI8s()};
  if (condition <= 0) {istate.IPTR_prime = istate.JPTR();};
```

TABLE 1

| TDR/VCR | | | 0x000000 | | |
|---|---|---|---|---|---|
| Field | Bits | Size | Volatile? | Synopsis | Type |
| perr_flags | [0,7] | 8 | / | R-port error flags | Varies |
| | HARD reset | | 0 | | |
| merr_flags | [8,15] | 8 | / | TDR module error flags | Varies |
| | HARD reset | | 0 | | |
| mod-vers | [16,31] | 16 | — | Module version | RO |
| | HARD reset | | 0x0000 | | |
| mod_id | [32,47] | 16 | — | Module identity | RO |
| | HARD reset | | 0x1005 | | |
| bot_mb | [48,55] | 8 | — | Bottom memory block | RO |
| | HARD reset | | 0x0A | | |
| top_mb | [56,63] | 8 | — | Top memory block | RO |
| | HARD reset | | 0x0A | | |

TABLE 2

.tab

```
+=Table_001
+title TDR/VCR register description
+headings
TDR.VCR&&&&0x000000&
Field&Bits&Size&Volatile?&Synopsis&Type
+text
perr_flags&[0,7]&8&3&P-port error flags&Varies
&HARD reset&&0&&
merr_flags&[8,15]&8&3&TDR module error
flags&Varies
&HARD reset&&0&&
mod_vers&[16,31]&16& &Module version&RO
&HARD reset&&0x0000&&
mod_id&[32,47]&16& &Module identity&RO
&HARD reset&&0x1005&&
bot_mb&[48,55]&8& &Bottom memory block&RO
&HARD reset&&0x0A&&
top_mb&[56, 63]&8& &Top memory block&RO
&HARD reset&&0x0A&&
```

TABLE 3

AD

```
+=TDR.VCR
+fields
err_snt 1 1 RW 0
bad_addr 2 1 RW 0
unsol_resp 3 1 RW 0
opc_err 8 1 RW 0
len_err 9 1 RW 0
mod_vers 16 16 RO 0
mod_id 32 16 RO 0x1005
bot_mb 48 8 RO 0xA
top_mb 56 8 RO 0xA
+size 8
+address 0
```

What is claimed is:

1. A method of automated generation of a set of design data defining a system model from an architecture database which is configured to hold in an electronic storage medium architectural parameters wherein each architectural parameter is defined by a primary key field and a set of fields holding subsidiary data relating to the primary key, the method comprising:

reading the primary key for each architectural parameter;

generating in an electronic storage medium a structured definition entry of the architectural parameter in an electronically readable format, the structured definition entry being associated with an identification field defining the parameter; and loading the primary key into the identification field and the subsidiary data into the structured definition entry, and wherein the structured definition entry takes the form of a programming definition of the architectural parameter in a modelling language.

2. A method according to claim 1, which further comprises the step of generating a definition file from the structured definition entries of the architectural parameter.

3. A method according to claim 2, wherein the definition file is an executable model view.

4. A method according to claim 2, wherein the definition file is a micro-architecture view.

5. A method according to claim 2, wherein the definition file is a verification view.

6. A method according to claim 1, wherein the architecture database holds a plurality of different classes of architectural parameters, and wherein the structured definition entry differs for each class.

7. A method according to claim 6, wherein one of said classes is instructions.

8. A method according to claim 6, wherein one of said classes is operands.

9. A method according to claim 6, wherein one of said classes is system registers.

10. A method according to claim 6, wherein one of said classes is control registers.

11. A method of designing a processor comprising:

defining a processor specification and generating from the processor specification architectural parameters implementing the specification;

loading the architectural parameters into an electronic storage medium to create an architectural database which is configured to hold in an electronic storage medium architectural parameters wherein each architectural parameter is defined by a primary key field and a set of fields holding subsidiary data relating to the primary key;

creating in an electronically readable medium text in a humanly readable format defining the architectural parameters in a structured tabular format wherein a table title holds the primary key for each architectural parameter;

modifying the processor specification and effecting manually consequential modification to the architectural parameters in the text; and using a translation tool in the form of a program executed by a computer to automatically transfer the modification into the database by locating any new or modified tables in the tabular format and loading the table title into the primary key field and other data in the table into the set of fields for subsidiary data in a predetermined manner.

12. A method of designing a processor comprising:

defining a processor specification and generating from the processor specification architectural parameters implementing the specification;

loading the architectural parameters into an electronic storage medium to create an architectural database which is configured to hold architectural parameters wherein each architectural parameter is defined by a primary key field and a set of fields holding subsidiary data relating to the primary key;

creating in an electronically readable medium text in a humanly readable format defining the architectural parameters in a structured tabular format wherein a table title holds a primary key for each architectural parameter;

modifying the processor specification and effecting manually consequential modifications to the architectural parameters in the architectural database; and using a translation tool in the form of a program executed by a computer to automatically transfer the modifications into the text from the database by loading the contents of the primary key field and subsidiary fields into the structured tabular format.

13. A method of automated generation of a set of design data defining a system model from an architecture database which is configured to hold in an electronic storage medium architectural parameters wherein each architectural parameter is defined by a primary key field and a set of fields holding subsidiary data relating to the primary key, the method comprising acts of:

reading the primary key for each architectural parameter;

generating in the electronic storage medium a structured definition entry of the architectural parameter in an electronically readable format, the structured definition entry being associated with an identification field defining the parameter;

loading the primary key into the identification field and the subsidiary data into the structured definition entry, wherein the structured definition entry takes the form of a programming definition of the architectural parameter in a modelling language; and generating said set of design data from the structured definition entries.

14. A method according to claim 13, wherein the act of generating said set of design data comprises an act of generating a definition file from the structured definition entries of the architectural parameter.

15. A method according to claim 14, wherein the definition file includes at least one of an executable model view, a micro-architecture view, and a verification view.

16. A method according to claim 13, wherein the architecture database holds a plurality of different classes of architectural parameters, and wherein the structured definition entry differs for each class.

17. A method according to claim 16, wherein said classes include at least one of instructions, operands, system registers, and control registers.

* * * * *